(12) United States Patent
Dishongh et al.

(10) Patent No.: US 6,775,122 B1
(45) Date of Patent: Aug. 10, 2004

(54) CIRCUIT BOARD WITH ADDED IMPEDANCE

(75) Inventors: Terry Dishongh, Hillsboro, OR (US); Prateek Dujari, Portland, OR (US); Bin Lian, Hillsboro, OR (US); Damion Searls, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/473,128

(22) Filed: Dec. 28, 1999

(51) Int. Cl.[7] .............................................. H01G 4/32
(52) U.S. Cl. ................... 361/301.5; 361/306.1; 361/794; 361/818; 361/763; 174/35; 174/250
(58) Field of Search .................... 361/301.5, 306.1, 361/751, 794, 816, 818, 763–766; 174/35, 250

(56) References Cited

U.S. PATENT DOCUMENTS

| | | | | |
|---|---|---|---|---|
| 4,091,430 A | * | 5/1978 | Berard | 361/43 |
| 5,038,252 A | * | 8/1991 | Johnson | 361/414 |
| 5,266,036 A | * | 11/1993 | Lichtenwalter et al. | 439/65 |
| 5,428,506 A | * | 6/1995 | Brown et al. | 361/794 |
| 5,568,107 A | * | 10/1996 | Buuck et al. | 333/238 |
| 6,061,228 A | * | 5/2000 | Palmer et al. | 361/306.2 |
| 6,150,895 A | * | 11/2000 | Steigerwald et al. | 333/12 |
| 6,166,457 A | * | 12/2000 | Iguchi et al. | 307/91 |
| 6,215,372 B1 | * | 4/2001 | Novak | 333/12 |
| 6,215,373 B1 | * | 4/2001 | Novak et al. | 333/22 |
| 6,297,965 B1 | * | 10/2001 | Sasaki et al. | 361/782 |
| 6,337,798 B1 | * | 1/2002 | Hailey et al. | 361/763 |

* cited by examiner

*Primary Examiner*—Dean A. Reichard
*Assistant Examiner*—Nguyen Ha
(74) *Attorney, Agent, or Firm*—Kenyon & Kenyon

(57) ABSTRACT

A circuit board includes two planes. A via spans the planes, and an impedance component is placed in the via. The impedance component is coupled to both of the planes. The impedance component provides an impedance between the planes without the use of traces or hand soldering of components.

20 Claims, 2 Drawing Sheets

CIRCUIT BOARD WITH ADDED IMPEDANCE

FIELD OF THE INVENTION

The present invention is directed to semiconductor devices and electronic circuit boards. More particularly, the present invention is directed to added impedance in semiconductor devices and electronic circuit boards.

BACKGROUND OF THE INVENTION

Current designs of semiconductor circuits require certain impedances between the power plane and the ground plane. These impedances are generally placed on the die or on the substrate of the circuitry. For example, decoupling capacitors are typically placed in circuits, between the power plane and ground plane, to stabilize any undue voltage fluctuations in the traces. Similarly, resistances may also be used at various locations in circuits to add impedance.

FIG. 1 illustrates a semiconductor circuit with added impedance using known methods. Between a power plane 10 and ground 16, a surface mount capacitor 12 and a surface mount resistor 14 is added. Capacitor 12 and resistor 14 are usually hand-soldered on the substrate requiring additional resources. They also occupy precious real estate on the substrate. In addition, due to the considerable length of the trace (L) between power plane 10 and ground 16, the trace can act as an antenna for electromagnetic interference ("EMI") and other high frequency noises.

Based on the foregoing, there is a need for an improved method and apparatus for adding impedance between planes in a semiconductor circuit.

SUMMARY OF THE INVENTION

One embodiment of the present invention is a circuit board that includes two planes. A via spans the planes, and an impedance component is placed in the via. The impedance component is coupled to both of the planes.

DETAILED DESCRIPTION

One embodiment of the present invention is a circuit board that includes impedance components inserted in the vias between two planes.

Figure 1:
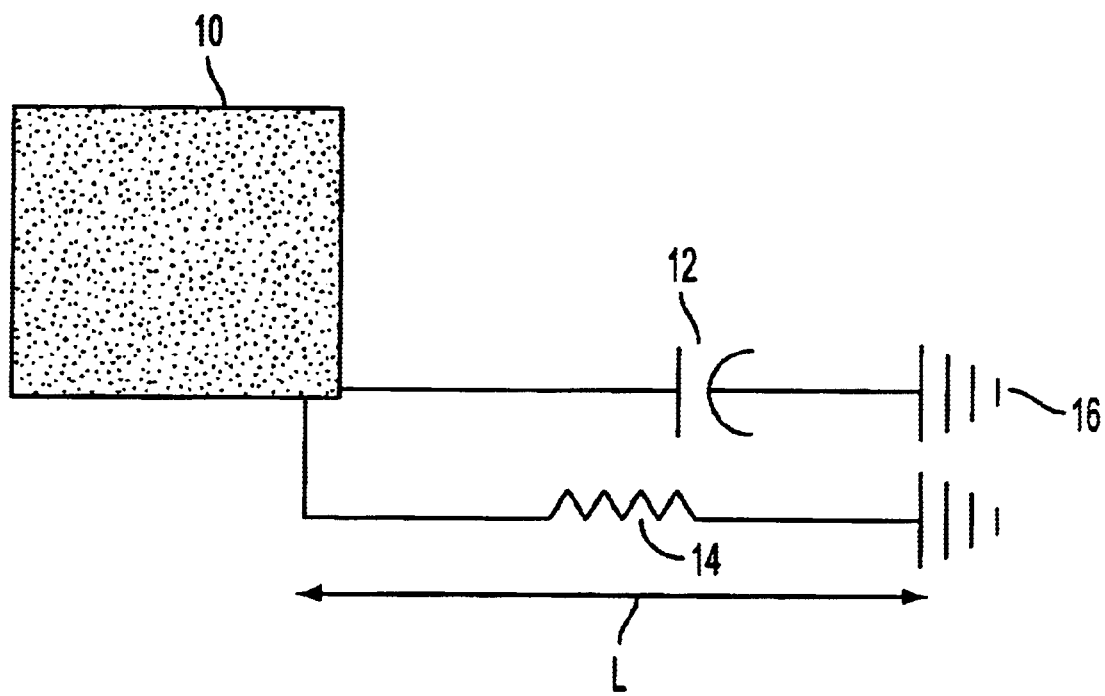
FIG. 1 illustrates in a semiconductor circuit with added impedance using known methods.
Figure 2:
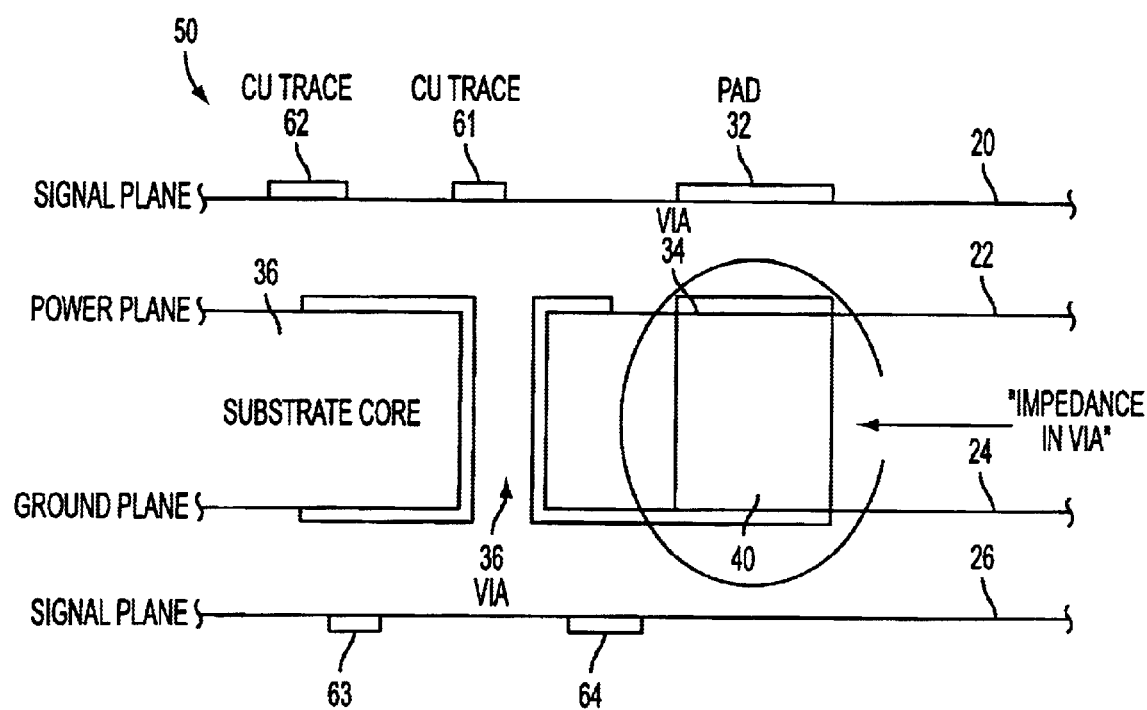
FIG. 2 illustrates a circuit board in accordance with one embodiment of the present invention.

FIG. 2 illustrates a circuit board 50 in accordance with one embodiment of the present invention. Circuit board 50 includes four layers: signal planes 20 and 26; a power plane 22; and a ground plane 24. Power plane 22 and ground plane 24 are sandwiched around a substrate core 36. Circuit board 50 further includes a pad 32, and copper ("Cu") traces 61–64. Finally, circuit board 50 includes multiple vias 34 and 36 that are openings spanning two or more planes.

In order to add impedance between planes of circuit board 50, an impedance component is inserted inside a via and coupled to each of the planes. An impedance component is a circuit device that adds impedance, such as a resistor or a capacitor. In the example shown in FIG. 2, an impedance component 40 is placed inside via 34 and connects power plane 22 directly to ground plane 24.

If a resistance impedance is desired, in one embodiment a resistor is formed by rolling carbon material into a cylinder of approximately the same diameter as via 34. The "roll" is then cut into the desired height approximating the height of via 34, and is capped with conductive material. The resistor roll is then press fitted into via 34 using, for example, forced air, and each cap is coupled to one of the planes.

If a capacitance impedance is desired, in one embodiment a capacitor is formed by rolling a sandwich of a dielectric material on top of conductive material to the desired diameter. The "roll" is then cut to the desired height, and the interior and exterior of the roll is capped. The capacitor roll is then press fitted into via 34 and each cap is coupled to one of the planes.

By placing an impedance component in a via of a circuit board, various advantages over prior art methods of adding impedance are achieved. The advantages include: eliminating the process of hand soldering the capacitor/resistor; not occupying any real estate on the circuit board; and eliminating high frequency noise that would otherwise be picked up by a trace.

As described, the present invention places impedance components in vias of a circuit board in order to add impedance between planes. This eliminates many problems associated with adding impedance through trace lines and hand soldiered components.

Several embodiments of the present invention are specifically illustrated and/or described herein. However, it will be appreciated that modifications and variations of the present invention are covered by the above teachings and within the purview of the appended claims without departing from the spirit and intended scope of the invention.

For example, although a four layer circuit board is illustrated, any number of layers can utilize the invention in order to add impedance between two of the layers.

What is claimed is:

1. A circuit board comprising:
   a first plane;
   a second plane;
   a via spanning and intersecting said first and second plane; and
   an impedance component having an impedance portion, wherein at least part of the impedance portion is placed in said via and coupled to said first plane and said second plane.

2. The circuit board of claim 1, wherein said impedance component is a capacitor.

3. The circuit board of claim 1, wherein said first plane is a power plane and said second plane is a ground plane.

4. The circuit board of claim 1, wherein said first plane is a signal plane.

5. The circuit board of claim 2, wherein said capacitor comprises:
   a rolled sandwich comprising dielectric material and conductive material and having an interior and an exterior; and
   a first conductive cap coupled to said interior, and a second conductive cap coupled to said exterior;
   wherein said first conductive cap is coupled to said first plane, and said second conductive cap is coupled to said second plane.

6. A method of adding impedance to a circuit board having a first plane, a second plane, and a via spanning and intersecting said first and second plane, said method comprising:
   forming an impedance component having a first conductive cap and a second conductive cap and having an impedance portion;
   placing at least part of said impedance portion in said via; and coupling said first cap to said first plane and said second cap to said second plane.

7. The method of claim 6, wherein said impedance component is a capacitor.

8. The method of claim 6, wherein said first plane is a power plane and said second plane is a ground plane.

9. The method of claim 6, wherein said first plane is a signal plane.

10. The method of claim 6, wherein said via has a first height and a first diameter, and wherein said impedance component has a second height substantiality equal to said first height and a second diameter substantially equal to said first diameter.

11. A circuit board comprising:

a plurality of planes;

a via spanning and intersecting at least two of said planes; and an impedance component having an impedance portion, wherein at least part of the impedance portion is placed in said via and coupled to at least two of said planes.

12. The circuit board of claim 11, wherein said impedance component is a capacitor.

13. The circuit board of claim 11, wherein one of said planes is a power plane and one of said planes is a ground plane.

14. The circuit board of claim 11, wherein one of said planes is a signal plane.

15. The circuit board of claim 12, wherein said capacitor comprises:

a rolled sandwich comprising dielectric material and conductive material and having an interior and an exterior; and a first conductive cap coupled to said interior, and a second conductive cap coupled to said exterior;

wherein said first conductive cap is coupled to one of said planes, and said second conductive cap is coupled to a different one of said planes.

16. The circuit board of claim 1, wherein said impedance component is a resistor.

17. The circuit board of claim 16, wherein said resistor comprises:

rolled carbon material having a first end and a second end; and a first conductive cap coupled to said first end, and a second conductive cap coupled to said second end;

wherein said first conductive cap is coupled to said first plane, and said second conductive cap is coupled to said second plane.

18. The method of claim 6, wherein said impedance component is a resistor.

19. The circuit board of claim 11, wherein said impedance component is a resistor.

20. The circuit board of claim 19, wherein said resistor comprises:

rolled carbon material having a first end and a second end; and a first conductive cap coupled to said first end, and a second conductive cap coupled to said second end;

wherein said first conductive cap is coupled to one of said planes, and said second conductive cap is coupled to a different one of said planes.

* * * * *